United States Patent
Moon et al.

(10) Patent No.: US 7,554,866 B2
(45) Date of Patent: Jun. 30, 2009

(54) CIRCUIT AND METHOD OF CONTROLLING INPUT/OUTPUT SENSE AMPLIFIER OF A SEMICONDUCTOR MEMORY DEVICE

(75) Inventors: Jang-won Moon, Anyang-si (KR); Jong-Hyoung Lim, Hwaseong-si (KR)

(73) Assignee: Samsung Electroncis Co., Ltd. (KR)

( * ) Notice: Subject to any disclaimer, the term of this patent is extended or adjusted under 35 U.S.C. 154(b) by 0 days.

(21) Appl. No.: 11/820,836

(22) Filed: Jun. 21, 2007

(65) Prior Publication Data
US 2008/0008011 A1 Jan. 10, 2008

(30) Foreign Application Priority Data
Jul. 6, 2006 (KR) .................. 10-2006-0063366

(51) Int. Cl.
*G11C 7/00* (2006.01)
*G11C 7/10* (2006.01)
*H03F 3/45* (2006.01)

(52) U.S. Cl. .................. 365/205; 365/189.05; 365/191; 365/193; 365/196; 327/57

(58) Field of Classification Search ............ 365/189.05, 365/191, 193, 196, 205
See application file for complete search history.

(56) References Cited

U.S. PATENT DOCUMENTS

| 6,449,204 B1 * | 9/2002 | Arimoto et al. ............. 365/222 |
| 2002/0181301 A1 * | 12/2002 | Takahashi et al. ........... 365/200 |
| 2003/0133350 A1 * | 7/2003 | Nakao .................... 365/230.03 |

FOREIGN PATENT DOCUMENTS

| KR | 2003-0079011 | 10/2003 |
| KR | 10-2004-0009543 | 1/2004 |
| KR | 10-2005-0054595 | 6/2005 |

* cited by examiner

*Primary Examiner*—Ly D Pham
(74) *Attorney, Agent, or Firm*—Mills & Onello LLP

(57) ABSTRACT

An input/output sense amplifier (IOSA) controller of a semiconductor memory device includes an auto pulse generator and a latch enable signal generating circuit. The auto pulse generator generates an auto pulse signal having a first pulse shape. The latch enable signal generating circuit generates a first latch enable signal having a second pulse shape in response to an auto pulse signal in normal mode, and generates a second latch enable signal having a level shape that is enabled for long duration in response to the write enable bar signal in test mode. Accordingly, the semiconductor memory device including the IOSA controller may safely test a characteristic of the IOSA.

9 Claims, 10 Drawing Sheets

CIRCUIT AND METHOD OF CONTROLLING INPUT/OUTPUT SENSE AMPLIFIER OF A SEMICONDUCTOR MEMORY DEVICE

CROSS-REFERENCE TO RELATED APPLICATIONS

This application claims priority under 35 USC § 119 to Korean Patent Application No. 10-2006-0063366, filed on Jul. 6, 2006 in the Korean Intellectual Property Office (KIPO), the contents of which are incorporated herein in their entirety by reference.

BACKGROUND OF THE INVENTION

1. Field of the Invention

The present invention relates to a semiconductor memory device, and more particularly to a semiconductor memory device for safely testing a characteristic of an input/output sense amplifier.

2. Description of the Related Art

An input/output sense amplifier (IOSA) converts a signal provided from a memory cell array into a high level signal suitable for outputting the signal to an external device.

The IOSA is a sensitive circuit block and markedly affects operational characteristics of the semiconductor memory device. Therefore, a characteristic test of the IOSA is essentially required when the semiconductor memory device is tested.

Figure 1:
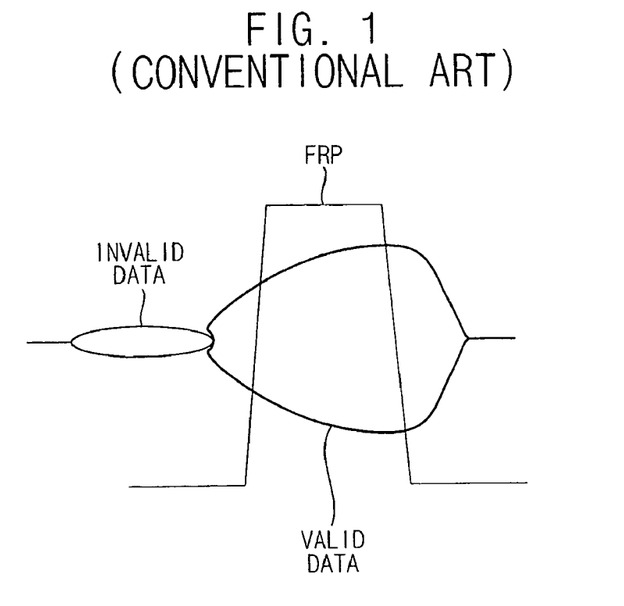
FIG. 1 is a timing diagram illustrating a relationship between a latch enable signal of an input/output sense amplifier (IOSA) and output data in a conventional semiconductor memory device.

FIG. 1 is a timing diagram illustrating a relationship between a latch enable signal of an IOSA and output data in a conventional semiconductor memory device.

The IOSA is typically tested based on a latch enable signal having a first pulse shape generated by an auto pulse generator both in test mode and normal mode. FIG. 1 illustrates an example of the latch enable signal of the IOSA. The latch enable signal of FIG. 1 is in an enabled state during a valid data period, and has a second pulse shape. Therefore, the valid data is tested alone, and a test error occurs when the IOSA having the timing characteristic of FIG. 1 is tested. In the conventional IOSA, a delay time of the latch enable signal is increased or decreased, or a pulse duration of the latch enable signal is increased for testing output data of the IOSA during the valid data period.

Accordingly, a method of testing not only valid data but also invalid data and data of a global input/output line is required.

SUMMARY OF THE INVENTION

Accordingly, the present invention is provided to substantially obviate one or more problems due to limitations and disadvantages of the related art.

Some embodiments of the present invention provide an input/output sense amplifier (IOSA) control circuit that safely tests a characteristic of the IOSA.

Some embodiments of the present invention provide a semiconductor memory device that safely tests the characteristic of the IOSA.

Some embodiments of the present invention provide a method of controlling the IOSA that safely tests the characteristic of the IOSA.

According to a first aspect, the present invention is directed to an input/output sense amplifier (IOSA) control circuit, which includes an auto pulse generator and a latch enable signal generating circuit. The auto pulse generator generates an auto pulse signal having a first pulse shape. The latch enable signal generating circuit generates a first latch enable signal having a second pulse shape that activates a latch in the IOSA in response to the auto pulse signal in normal mode and generates a second latch enable signal having a level shape for activating the latch in response to a write enable bar signal in test mode.

In some embodiments, the second latch enable signal may be in an enabled state during a first interval when valid output data is generated and during a second interval when invalid output data is generated.

In some embodiments, the auto pulse generator may generate the auto pulse signal in response to a column select signal.

In some embodiments, the first latch enable signal may be generated when a test mode signal is in disabled state, and the second latch enable signal may be generated when the test mode signal is in enabled state.

In some embodiments, the test mode signal may correspond to a test mode register set signal.

In some embodiments, the latch enable signal generating circuit may include a first inverter, a second inverter, a first AND gate, a second AND gate, and an OR gate. The first inverter may invert the test mode signal. The second inverter may invert the write enable bar signal. The first AND gate may perform an AND operation on the auto pulse signal and an output signal of the first inverter to generate a first signal. The second AND gate may perform an AND operation on the test mode signal and an output signal of the second inverter to generate a second signal. The OR gate may perform an OR operation on the first signal and the second signal to output the first latch enable signal and the second latch enable signal.

In some embodiments, the IOSA control circuit may further include a column select signal generating circuit that generates the column select signal based on a clock signal and a read signal.

According to another aspect, the present invention is directed to a semiconductor memory device, which includes an input/output sense amplifier (IOSA) and an output circuit. The IOSA turns on or off a latch included in the IOSA in response to a latch enable signal having a second pulse shape in a normal mode and having a level shape in a test mode, and amplifies a signal on a global input/output line pair to generate first data. The output circuit determines an output order of the first data, selects an output bit structure, and performs a parallel-to-serial conversion to generate an output data.

In some embodiments, the latch enable signal may be in an enabled state during a first interval when valid output data is generated and during a second interval when invalid output data is generated.

In some embodiments, the latch enable signal having the second pulse shape may be generated in response to an auto pulse signal in the normal mode, and the latch enable signal having the level shape may be generated in response to a write enable bar signal in the test mode.

In some embodiments, the semiconductor memory device may further include an IOSA controller generating the latch enable signal.

In some embodiments, the IOSA controller may include an auto pulse generator and a latch enable signal generating circuit. The auto pulse generator may generate the auto pulse signal having a first pulse shape. The latch enable signal generating circuit may generate a first latch enable signal having a second pulse shape for activating the latch included in the IOSA in response to the auto pulse signal in the normal mode, and may generate a second latch enable signal having a level shape for activating the latch in response to the write enable bar signal in the test mode.

In some embodiments, the second latch enable signal may be in an enabled state during the first interval when the valid output data is generated and during the second interval when invalid output data is generated.

In some embodiments, the auto pulse generator may generate the auto pulse signal in response to a column select signal.

In some embodiments, the first latch enable signal may be generated when a test mode signal is in a disabled state and the second latch enable signal may be generated when the test mode signal is in an enabled state.

In some embodiments, the test mode signal may correspond to a test mode register set signal.

In some embodiments, the latch enable generating circuit may include a first inverter, a second inverter, a first AND gate, a second AND gate, and an OR gate. The first inverter may invert the test mode signal. The second inverter may invert the write enable bar signal. The first AND gate may perform an AND operation on the auto pulse signal and an output signal of the first inverter to generate a first signal. The second AND gate may perform an AND operation on the test mode signal and an output signal of the second inverter to generate a second signal. The OR gate may perform an OR operation on the first signal and the second signal to output the first latch enable signal and the second latch enable signal.

In some embodiments, the IOSA controller may further include a column select signal generating circuit that generates the column select signal based on a clock signal and a read signal.

In some embodiments, the IOSA may include a current sense amplifier, a differential amplifier, and a latch circuit. The current sense amplifier may amplify a current signal pair flowing on the global input/output line pair to generate a first amplification signal pair. The differential amplifier may amplify a differential component of the first amplification signal pair to generate a second amplification signal pair. The latch circuit may be enabled based on the latch enable signal and may latch the second amplification signal pair.

In some embodiments, the differential amplifier may include a first differential amplifying unit, a second differential amplifying unit, and a switch. The first differential amplifying unit may amplify the first amplification signal pair to generate a first differential amplification signal, and may provide the first differential amplification signal to a first node. The second differential amplifying unit may amplify the first amplification signal pair to generate a second differential amplification signal that is an inverted signal of the first differential amplification signal, and may provide the second differential amplification signal to a second node. The switch may electrically connect the first node and the second node in response to an inverted signal of the latch enable signal.

In some embodiments, the switch may include a metal oxide semiconductor (MOS) transistor.

In some embodiments, the latch circuit may include a latch-type differential amplifier, a AND gate, a NAND gate, a p-type metal oxide semiconductor (PMOS) transistor, and an n-type metal oxide semiconductor (NMOS) transistor. The latch-type differential amplifier may amplify and latch the second amplification signal pair to generate a first latch signal and a second latch signal. The AND gate may perform an AND operation on the first latch signal and a first control signal that is an inverted and delayed signal of the latch enable signal. The NAND gate may perform an NAND operation on the first control signal and the second latch signal. The PMOS transistor may pull up the first node in response to an output signal of the NAND gate, the PMOS transistor may be connected between a power supply voltage and the first node. The NMOS transistor may pull down the first node in response to an output signal of the AND gate, the NMOS transistor may be connected between a ground voltage and the first node.

In some embodiments, the output circuit may include an ordering circuit, a first multiplexer, and a second multiplexer. The ordering circuit may determine the output order of the first data. The first multiplexer may select the output bit structure, and may output second data in response to an output signal of the ordering circuit. The second multiplexer may perform the parallel-to-serial conversion of the second data to generate third data.

In some embodiments, the output circuit may further include a driving circuit that enhances a driving capability and generates the output data in response to the third data.

According to another aspect, the present invention is directed to a method for controlling an input/output sense amplifier (IOSA), which includes generating a first latch enable signal having a second pulse shape in response to an auto pulse signal in a normal mode, activating a latch included in the IOSA in response to the first latch enable signal, generating a second latch enable signal having a level shape in response to a write enable bar signal in a test mode, and activating the latch included in the IOSA in response to the second latch enable signal.

In some embodiments, the second latch enable signal may be in an enabled state during a first interval when valid output data is generated and during a second interval when invalid output data is generated.

Accordingly, the IOSA control circuit and the semiconductor memory device including the IOSA control circuit according to example embodiments of the present invention may test a characteristic of the IOSA safely.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EMBODIMENTS

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
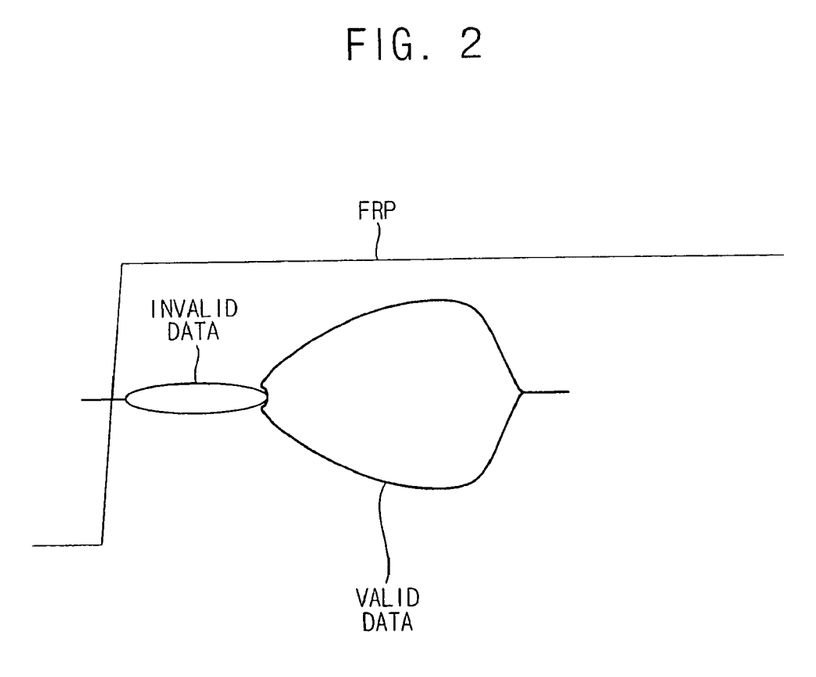
FIG. 2 is a timing diagram illustrating a relationship between a latch enable signal and output data in test mode in a semiconductor memory device according to an example embodiment of the present invention.

FIG. 2 is a timing diagram illustrating a relationship between a latch enable signal and output data in a test mode in a semiconductor memory device according to an example embodiment of the present invention.

Referring to the FIG. 2, the latch enable signal FRP is in an enabled state during a first interval when valid data is generated and during a second interval when invalid data is generated. Therefore, a characteristic test of an input/output sense amplifier (IOSA) may be performed easily and safely based on the latch enable signal FRP having a level shape such that the latch enable signal FRP is in the enabled state for a long duration as illustrated in FIG. 2.

Figure 3:
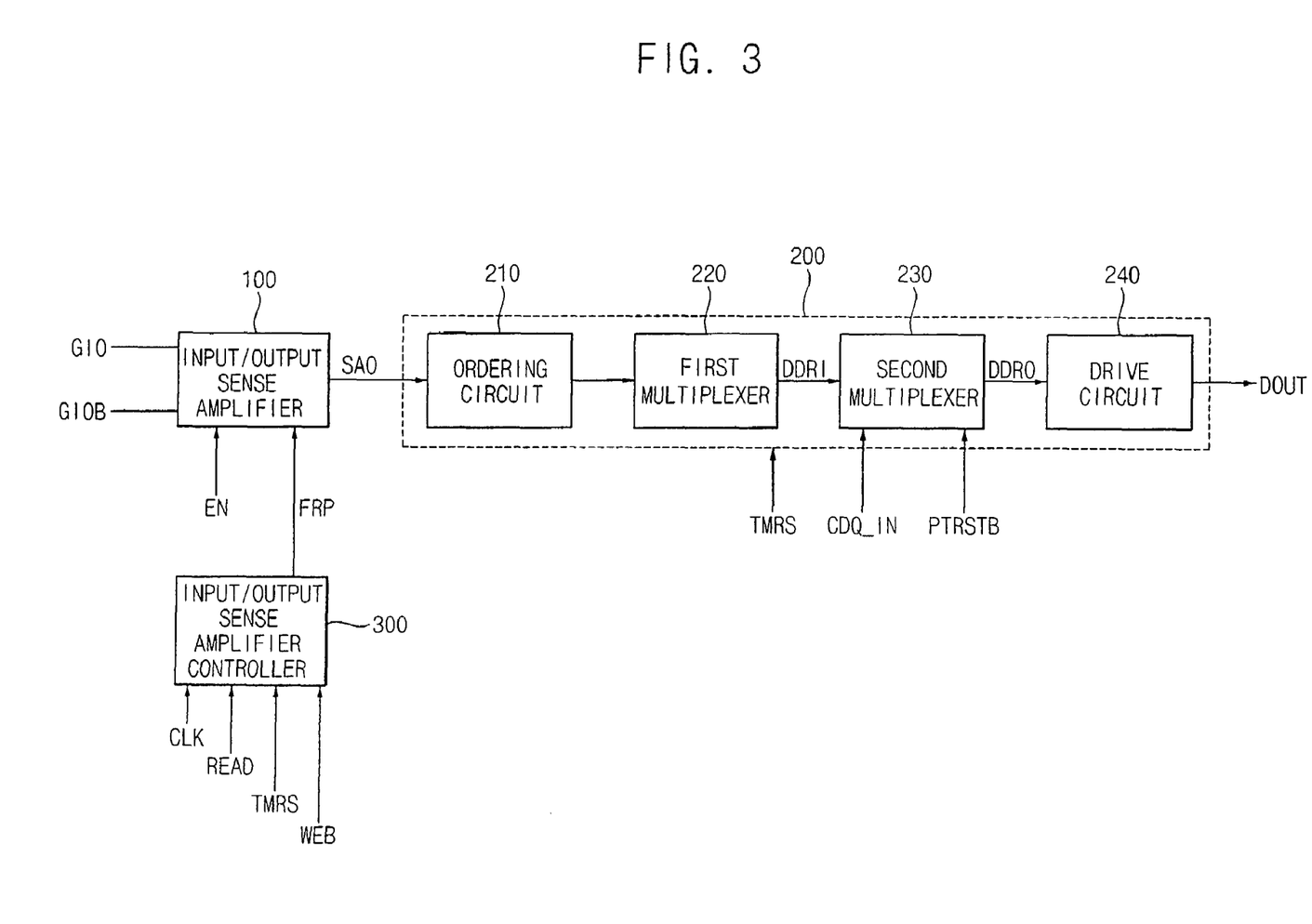
FIG. 3 is a block diagram illustrating parts of a semiconductor memory device according to an example embodiment of the present invention.

FIG. 3 is a block diagram illustrating parts of a semiconductor memory device according to an example embodiment of the present invention.

Referring to FIG. 3, the semiconductor memory device includes an input/output sense amplifier (IOSA) 100, an output circuit 200 and an IOSA controller 300.

The IOSA 100 turns on or turns off a latch in the IOSA 100 in response to a latch enable signal FRP, and amplifies a signal on a global input/output line pair GIO and GIOB to generate first data SAO. The latch enable signal FRP has a second pulse shape in a normal mode and a level shape in a test mode. Additionally, the IOSA 100 is turned on or off in response to a sense amplifier enable signal EN. The output circuit 200 operates in response to a test mode signal TMRS. The output circuit 200 determines an output order of the first data SAO, selects an output bit structure, and performs a parallel-to-serial conversion to generate output data DOUT. The IOSA controller 300 generates the latch enable signal FRP in response to a clock signal CLK, a read signal READ, the test mode MRS (Mode Register Set) signal TMRS, and a write enable bar signal WEB. The IOSA controller 300 generates the latch enable signal FRP having the second pulse shape in response to an auto pulse signal in normal mode, and generates the latch enable signal FRP having the level shape, which is in enabled state for a long duration in response to the write enable bar signal WEB in test mode.

The output circuit 200 includes an ordering circuit 210, a first multiplexer 220, a second multiplexer 230, and a drive circuit 240.

The ordering circuit 210 determines an output order of the first data SAO. The first multiplexer 220 selects an output bit structure and outputs a second data DDRI in response to an output signal of the ordering circuit 210. The second multiplexer 230 performs a parallel-to-serial conversion of the second data DDRI in response to an output data clock signal CDQ_IN and a signal PTRSTB to generate third data DDRO. The drive circuit 240 enhances a driving capability and generates an output data DOUT in response to the third data DDRO.

The semiconductor memory device of FIG. 3 may test not only valid data but also invalid data based on the latch enable signal FRP having the level shape, because the latch enable signal FRP having the level shape is in enabled state for a long duration in test mode.

Figure 4:
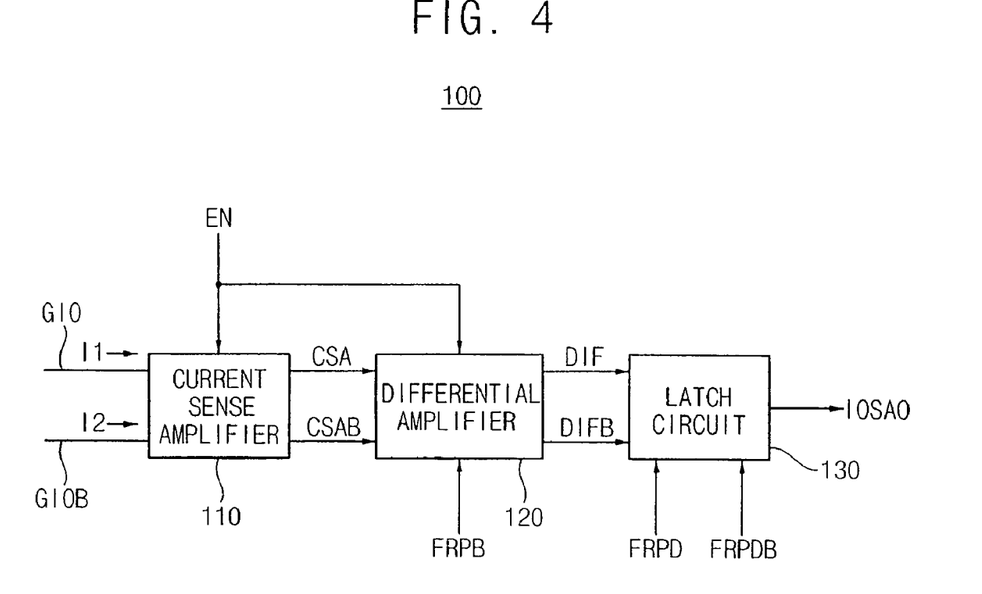
FIG. 4 is a block diagram illustrating an IOSA of the semiconductor memory device according to an example embodiment of the present invention.

FIG. 4 is a block diagram illustrating an input/output sense amplifier (IOSA) of the semiconductor memory device according to an example embodiment of the present invention.

Referring to FIG. 4, the IOSA 100 includes a current sense amplifier 110, a differential amplifier 120, and a latch circuit.

The current sense amplifier 110 amplifies a current signal pair I1 and I2 flowing through a global input/output line pair GIO and GIOB in response to a sense amplifier enable signal EN to generate a first amplification signal pair CSA and CSAB. The differential amplifier 120 amplifies a differential component of the first amplification signal pair CSA and CSAB in response to the sense amplifier enable signal EN and the latch enable signal FRP to generate a second amplification signal pair DIF and DIFB. The latch circuit 130 is enabled based on the latch enable signal FRP, latches the second amplification signal pair DIF and DIFB, and generates an output signal IOSAO. The output signal IOSAO of the IOSA 100 in FIG. 4 corresponds to the first data SAO in FIG. 3. In addition, a signal FRPB corresponds to an inverted signal of the latch enable signal FRP, a signal FRPD corresponds to a delayed signal of the latch enable signal FRP, and a signal FRPDB corresponds to an inverted signal of the delayed latch enable signal FRP.

Figure 5:
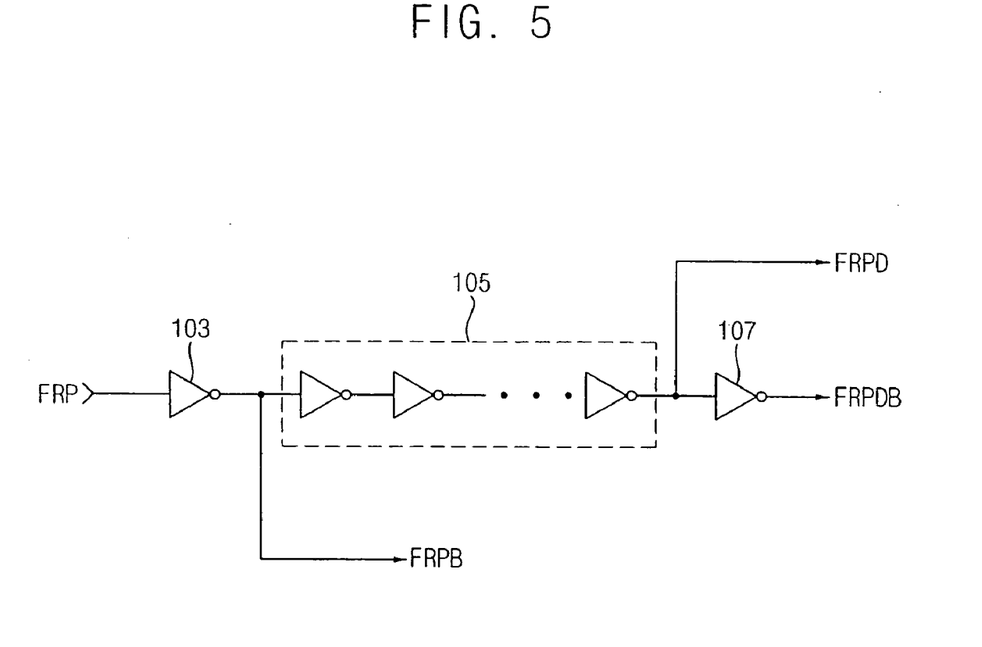
FIG. 5 is a circuit diagram illustrating a signal generating circuit that generates an inverted latch enable signal, a delayed latch enable signal, and a delayed-inverted latch enable signal which are used in the semiconductor memory device in FIG. 3 according to an example embodiment of the present invention.

FIG. 5 is a circuit diagram illustrating a signal generating circuit that generates the inverted latch enable signal FRPB, the delayed latch enable signal FRPD, and the delayed-inverted latch enable signal FRPDB, which are used in the semiconductor memory device in FIG. 3 according to an example embodiment of the present invention.

Referring to FIG. 5, the latch enable signal generating circuit includes inverters 103 and 107, and a delaying circuit 105. The inverter 103 inverts the latch enable signal FRP and generates the inverted latch enable signal FRPB. The delaying circuit 105 includes an odd number of inverters. In addition, the delaying circuit 105 inverts and delays an output signal of the inverter 103. An output signal of the delaying circuit 105 corresponds to the delayed latch enable signal FRPD. The inverter 107 inverts the output signal FRPD of the delaying circuit and generates the delayed-inverted latch enable signal FRPDB. The latch enable signal generating circuit in FIG. 5 may be included in IOSA controller 300 or in the IOSA 100 that are illustrated in FIG. 3.

Figure 6:
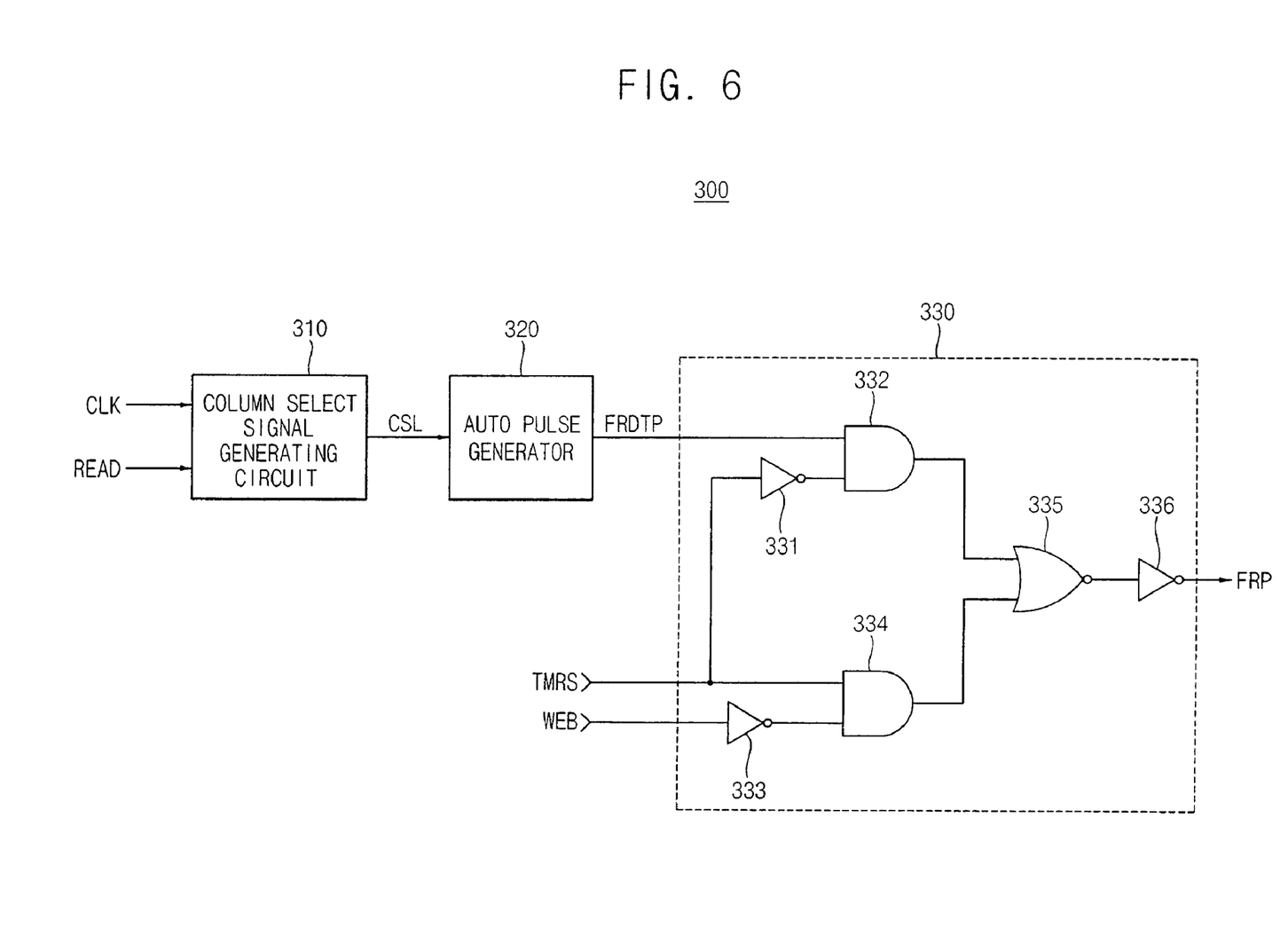
FIG. 6 is a block diagram illustrating an IOSA controller included in the semiconductor memory device in FIG. 3 according to an example embodiment of the present invention.

FIG. 6 is a block diagram illustrating an input/output sense amplifier (IOSA) controller 300 included in the semiconductor memory device in FIG. 3 according to an example embodiment of the present invention.

Referring to FIG. 6, the IOSA controller 300 includes a column select signal generating circuit 310, an auto pulse generator 320, and a latch enable signal generating circuit 330.

The column select signal generating circuit 310 generates a column select signal CSL based on a clock signal CLK and a read signal READ. The auto pulse generator 320 generates an auto pulse signal FRDTP having a first pulse shape in response to the column select signal CSL. The latch enable signal generating circuit 330 generates a latch enable signal FRP having a second pulse shape in response to the auto pulse signal FRDTP in a normal mode, and generates a latch enable signal FRP having a level shape that is in enabled state for a long duration in response to a write enable bar signal WEB signal in test mode.

The latch enable signal generating circuit 330 includes inverters 331 and 333, AND gates 332 and 334, a NOR gate 335, and an inverter 336. The NOR gate 335 and the inverter 336 constitutes an OR gate.

The inverter 331 inverts a test mode signal TMRS and the inverter 333 inverts the write enable bar signal WEB. The test mode signal TMRS may correspond to a test mode MRS (Mode Register Set) signal. The AND gate 332 performs an AND operation on the auto pulse signal and an output signal of the inverter 331. The AND gate 334 performs an AND operation on the test mode signal TMRS and an output signal of the inverter 333. The NOR gate 335 performs a NOR operation on an output signal of the AND gate 332 and an output signal of the AND gate 334. The inverter 336 inverts an output signal of the NOR gate 335 and outputs the latch enable signal FRP.

Hereinafter, an operation of the IOSA controller 300 in FIG. 6 is described.

The auto pulse signal FRDTP is a pulse that is generated by the auto pulse generator 320 and that is in enabled state for a short duration. In a conventional semiconductor memory device, a latch circuit included in the IOSA is turned on or off by the auto pulse signal FRDTP both in normal mode and test mode. Accordingly, an operating characteristic of the IOSA may not be tested safely because the only valid data may be tested and the auto pulse signal FRDTP is in enabled state for a short duration in the test mode.

The IOSA controller 300 includes the latch enable signal generating circuit 330 that outputs the auto pulse signal FRDTP as the latch enable signal FRP in normal mode and that outputs a signal having a level shape as the latch enable signal FRP in response to the write enable bar WEB signal in test mode. The latch enable signal FRP is in enabled state during a period when not only the valid data but also the invalid data are outputted because the latch enable signal FRP is in enabled state for a long duration. Therefore not only the valid data but also the invalid data and a nose signal may be tested.

Figure 7:
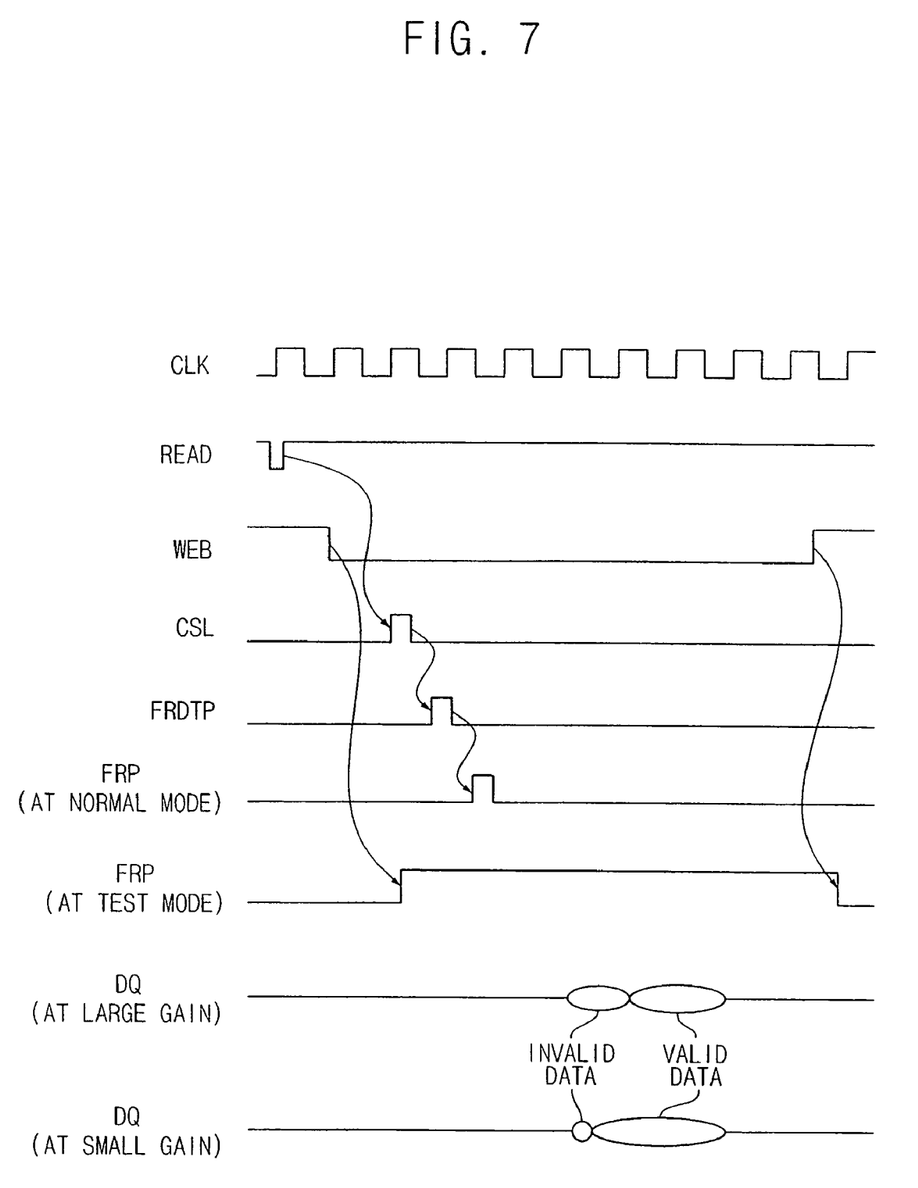
FIG. 7 is a timing diagram illustrating an operation of a semiconductor memory device according to an example embodiment of the present invention.

FIG. 7 is a timing diagram illustrating an operation of a semiconductor memory device according to an example embodiment of the present invention.

Referring to FIG. 7, the column signal is generated in response to the clock signal CLK and the read signal READ, and the auto pulse signal FRDTP is generated in response to the column select signal CLS. The latch enable signal FRP is generated in response to the auto pulse signal FRDTP in normal mode and the latch enable signal FRP is generated in response to the write enable bar signal WEB in test mode. Output data DQ includes the valid data and the invalid data. The latch enable signal FRP is in enabled state during a first interval when the valid data is generated and during a second interval when the invalid data is generated. In addition, the second interval is shorter when the IOSA has a small gain than when the IOSA has a large gain.

Figure 8:
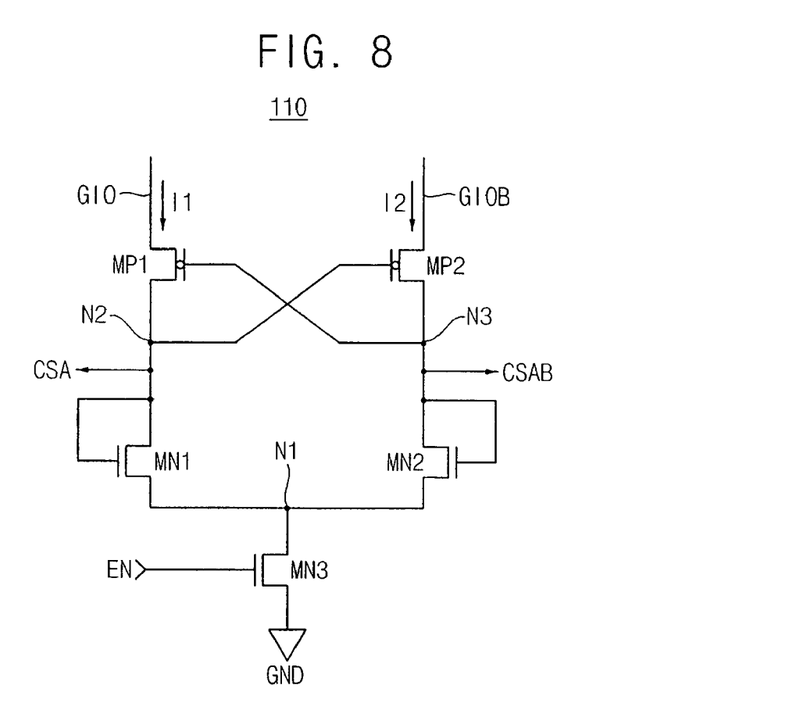
FIG. 8 is a circuit diagram illustrating a current sense amplifier included in the input/output sense amplifier in FIG. 4 according to an example embodiment of the present invention.

FIG. 8 is a circuit diagram illustrating a current sense amplifier 110 included in the IOSA 100 in FIG. 4 according to an example embodiment of the present invention.

Referring to FIG. 8, the current sense amplifier 110 includes p-type metal oxide semiconductor (PMOS) transistors MP1 and MP2, and n-type metal oxide semiconductor (NMOS) transistors MN1, MN2, and MN3.

The PMOS transistor MP1 has a source connected to a positive global input/output line GIO, a gate connected to a third node N3, and a drain connected to a second node N2. The PMOS transistor MP2 has a source connected to a negative global input/output line GIOB, a gate connected to the second node N2, and a drain connected to the third node N3. The NMOS transistor MN1 has a gate and a drain commonly connected to the second node N2, and a source connected to a first node N1. The NMOS transistor MN2 has a gate and a drain commonly connected to the third node N3, and a source connected to the first node N1. The NMOS transistor MN3 has a drain connected to the first node N1, a gate receiving a sense amplifier enable signal EN, and a source connected to a ground voltage GND. A first positive amplification signal CSA is outputted at the second node N2 and a first negative amplification signal CSAB is outputted at the third node N3.

The current sense amplifier 110 operates in response to the sense amplifier enable signal EN and amplifies a current signal pair I1 and I2 flowing through a global input/output line pair GIO and GIOB to generate the first amplification signal pair CSA and CSAB.

Figure 9:
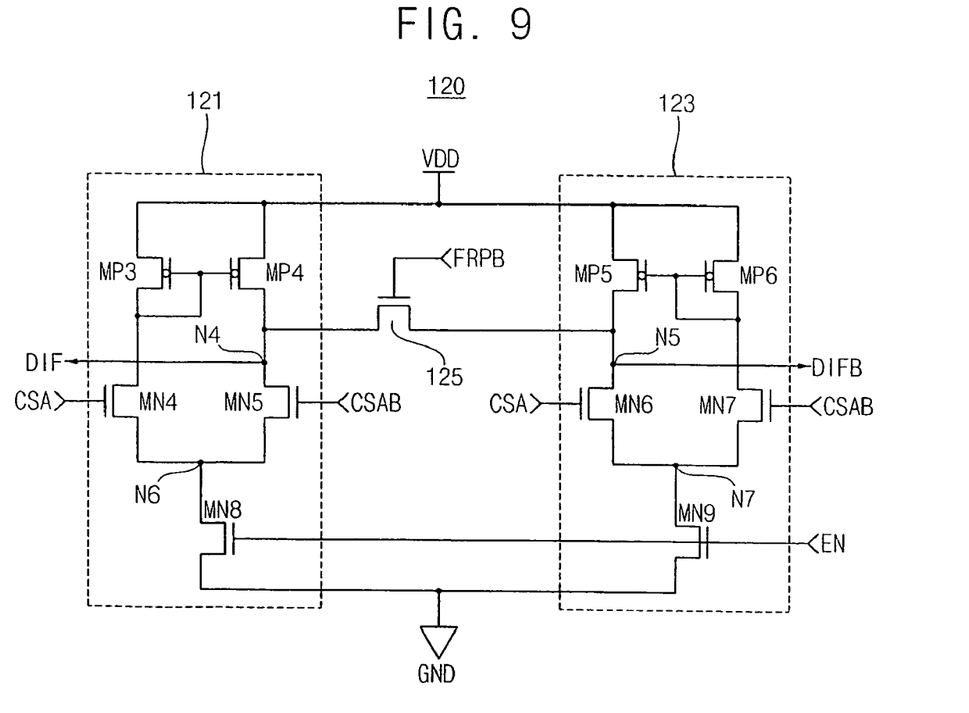
FIG. 9 is a circuit diagram illustrating a differential amplifier included in the IOSA in FIG. 4 according to an example embodiment of the present invention.

FIG. 9 is a circuit diagram illustrating a differential amplifier 120 included in IOSA100 in FIG. 4 according to an example embodiment of the present invention.

Referring to FIG. 9, the differential amplifier 120 includes a first differential amplifying unit 121, a second differential amplifying unit 123, and a NMOS transistor 125. The NMOS transistor 125 operates as a switch.

The first differential amplifying unit 121 amplifies the first amplification signal pair CSA and CSAB, generates a first differential signal DIF, and provides the first differential signal DIF through a fourth node N4. The second differential amplifying unit 123 amplifies the first amplification signal pair CSA and CSAB, generates a second differential signal DIFB, and provides the second differential signal DIFB through a fifth node N5. The NMOS transistor 125 performs a switching operation, and electrically connects the fourth node N4 and the fifth node N5, in response to an inverted latch enable signal FRPB.

The first differential amplifying unit 121 includes PMOS transistors MP3 and MP4 and NMOS transistors MN4, MN5, and MN8. The PMOS transistor MP4 has a source connected to the power supply voltage VDD and a drain connected to the fourth node N4. The PMOS transistor MP3 has a gate and drain commonly connected to a gate of the PMOS transistor MP4. The NMOS transistor MN4 has a gate receiving the first positive amplification signal CSA, a drain connected to the drain of the PMOS transistor MP3, and a source connected to a sixth node N6. The NMOS transistor MN5 has a gate receiving the first negative amplification signal CSAB, a drain connected to the drain of the PMOS transistor MP4, and a source connected to the sixth node N6. The NMOS transistor MN8 has a drain connected to the sixth node N6, a gate receiving the sense amplification enable signal EN, and a source connected to the ground voltage GND.

The second differential amplifying unit 123 includes PMOS transistors MP5 and MP6, and NMOS transistors MN6, MN7, and MN9. The PMOS transistor MP5 has a source connected to the power supply voltage and a drain connected to a fifth node N5. The PMOS transistor MP6 has a gate and a drain commonly connected to a gate of the PMOS transistor MP5. The NMOS transistor NM6 has a gate receiving the first positive amplification signal CSA, a drain connected to the drain of the PMOS transistor MP5, and a source connected to a seventh node N7. The NMOS transistor MN7 has a gate receiving the first negative amplification signal CSAB, a drain connected to the drain of the PMOS transistor MP6, and a source connected to the seventh node N7. The NMOS transistor MN9 has a drain connected to the seventh node N7, a gate receiving the sense amplifier enable signal EN, and a source connected to the ground voltage GND.

The differential amplifier 120 operates in response to the sense amplifier enable signal EN, amplifies the first amplification signal pair CSA and CSAB that is an output signal pair of the current sense amplifier 110, and generates a second amplification signal pair DIF and DIFB. The differential amplifier 120 includes the first differential amplifying unit 121, the second differential amplifying unit 123, and the NMOS transistor 125. In addition, when the latch enable signal FRP is in disabled state, that is, when the inverted latch enable signal FRPB is in enabled state, the differential amplifier 120 electrically connects the forth node N4 that is an output node of the first differential amplifying unit 121 and the fifth node N5 that is an output node of the second differential amplifying unit 123. When the latch enable signal FRP is in disabled state, each of the second amplification signal pair DIF and DIFB has same voltage. That is, the differential amplifier 120 may not generate a differential output when the latch enable signal FRP is in disabled state.

Figure 10:
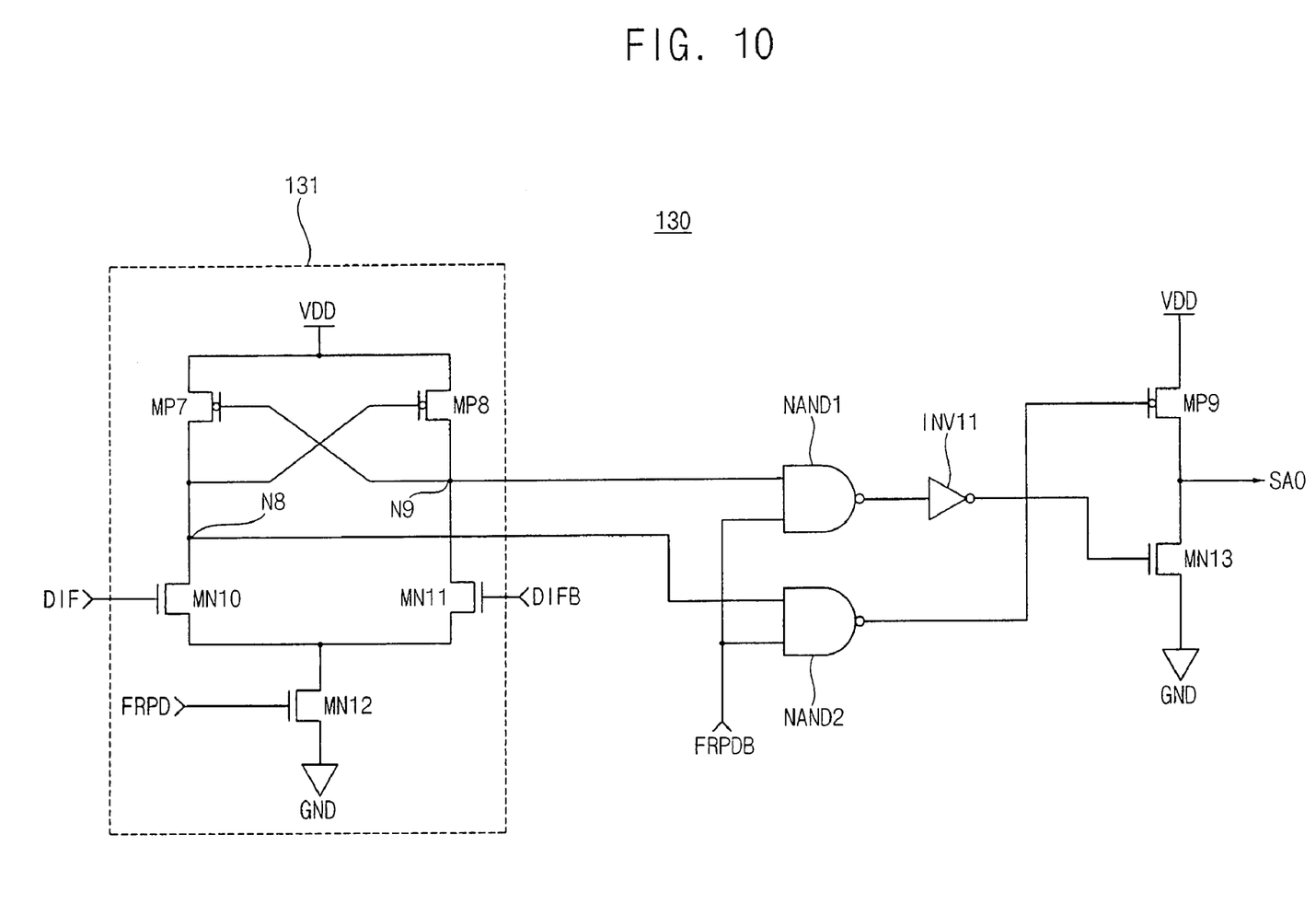
FIG. 10 is a circuit diagram illustrating a latch circuit included in the IOSA in FIG. 4 according to an example embodiment of the present invention.

FIG. 10 is a circuit diagram illustrating a latch circuit 130 included in the IOSA in FIG. 4 according to an example embodiment of the present invention.

Referring to FIG. 10, the latch circuit 130 includes a latch-type differential amplifier 131, a NAND gate NAND1, a NAND gate NAND2, an inverter INV11, a PMOS transistor MP9, and a NMOS transistor MN13.

The latch-type differential amplifier 131 amplifies and latches the second amplification signal pair DIF and DIFB to generate a first latch signal and a second latch signal. In addition, the latch-type differential amplifier 131 outputs the first latch signal through a ninth node N9 and outputs the second latch signal through a eighth node N8. The NAND gate NAND1 performs a NAND operation on the first latch signal and a delayed-inverted latch enable signal FRPDB that is delayed for a first time. The inverter INV11 inverts an output signal of the NAND gate NAND1. The NAND gate NAND2 performs a NAND operation on the second latch signal and the delayed-inverted latch enable signal FRPDB that is delayed for a second time. The PMOS transistor MP9 is connected between the power supply voltage VDD and an output node, and pulls up the output node voltage in response to an output signal of the NAND gate NAND2. The NMOS transistor MN13 is connected between the output node and the ground voltage GND, and pulls down the output node voltage in response to an output signal of the inverter INV11. An input/output sense amplifier output signal SAO is outputted at the output node.

The latch-type differential amplifier 131 includes PMOS transistors MP7 and MP8, and NMOS transistors MN10, MN11, and MN12.

The PMOS transistor MP7 has a source connected to the power supply voltage VDD, a gate connected to the ninth node N9, and a drain connected to the eighth node N8. The PMOS transistor MP8 has a source connected to the power supply voltage VDD, a gate connected to the eighth node N8, and a drain connected to the ninth node N9. The NMOS transistor MN12 has a gate receiving a delayed latch enable signal FRPD and a source connected to the ground voltage GND. The NMOS transistor MN10 has a drain connected to the eighth node N8, a gate receiving the second positive amplification signal DIF, and a source connected to a drain of the NMOS transistor MN12. The NMOS transistor MN11 has a drain connected to the ninth node N9, a gate receiving the second negative amplification signal DIFB, and a source connected to the drain of the NMOS transistor MN12.

The latch circuit 130 turns on the latch-typed differential amplifier 131 to amplify and to latch the second amplification signal pair DIF and DIFB when the signal FRPD that the latch enable signal FRP is delayed is in enabled state, In this case, the NAND gate NAND1 and the NAND gate NAND2 provide logic "high" outputs because the delayed and inverted latch enable signal FRPDB is in disabled state. In addition, the PMOS transistor MP9 and the NOMS transistor MN13 are turned off because the inverter INV11 provides an output signal of logic "low".

The latch circuit 130 turns off the latch-type differential amplifier 131 when the delayed latch enable signal FRPD is in disabled state. In this case, an output signal pair of a ninth node N9 and a eighth node N8 of the latch style differential amplifier 131 is outputted through the NAND gate NAND1 and the NAND gate NAND2 because the delayed-inverted latch enable signal FRPDB is in disabled state. The PMOS transistor MP9 or the NMOS transistor MN13 is turned on or off according to the logic state of the output signal pair of latch-typed differential amplifier 131 because the output signal pair is complementary.

Figure 11:
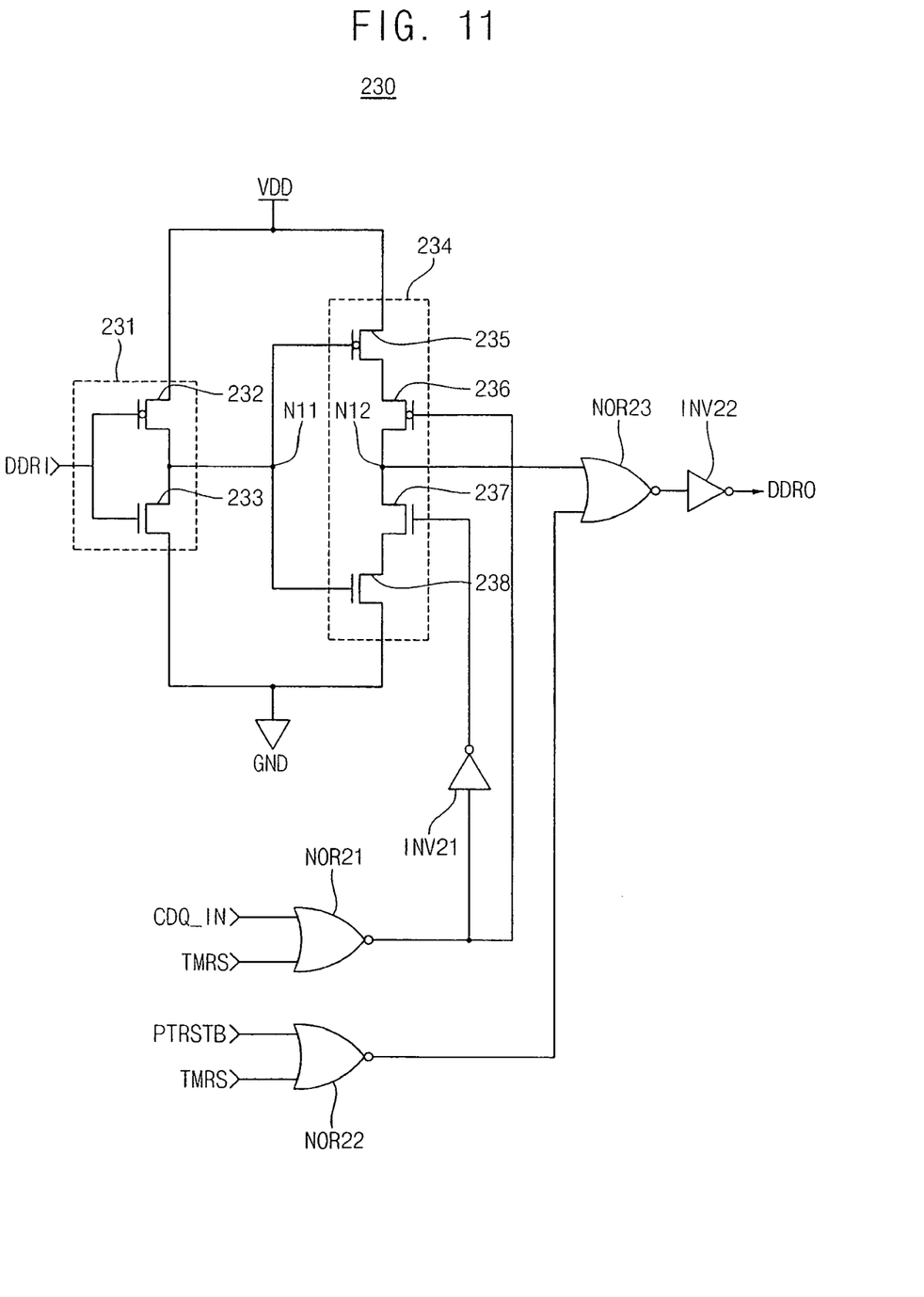
FIG. 11 is a circuit diagram illustrating a second multiplexer included in the semiconductor memory device in FIG. 3 according to an example embodiment of the present invention.

FIG. 11 is a circuit diagram illustrating a second multiplexer 230 included in the semiconductor memory device of FIG. 3 according to an example embodiment of the present invention.

A number of the second multiplexer 230 illustrated in FIG. 3 may be identical to a number of the output data DQ. Each output included in the second multiplexer 230 is outputted through an output line in response to an output clock signal CDQ_IN.

The second multiplexer 230 in FIG. 11 includes a first buffer 231, a second buffer 234, inverters INV21 and INV22, and NOR gates NOR21, NOR22, and NOR23.

The NOR gate NOR21 performs a NOR operation on the output clock signal CDQ_IN and the test mode signal TMRS. The NOR gate NOR22 performs a NOR operation on a PTRSTB signal and the test mode signal TMRS. The inverter INV21 inverts an output signal of the NOR gate NOR21. The first buffer 231 buffers and inverts a multiplexer input signal DDRI and provides the inverted signal to an eleventh node N11. The second buffer 234 buffers and inverts a signal of the eleventh node N11 and provides the inverted signal to a twelfth node N12 in response to the output signal of the NOR gate NOR21 and an output signal of the inverter INV21. The NOR gate NOR23 performs a NOR operation on a signal of the twelfth node N12 and an output signal of the NOR gate NOR22. The inverter INV22 inverts an output signal of the NOR gate NOR23 and outputs a multiplexer output signal DDRO.

The first buffer 231 includes a PMOS transistor 232 and a NMOS transistor 233. The second buffer 234 includes PMOS transistors 235 and 236, and NMOS transistors 237 and 238. A gate of the PMOS transistor 235 and a gate of the NMOS transistor 238 are commonly connected to the eleventh node N11. The PMOS transistor 236 performs switching operation in response to the output signal of the NOR transistor NOR21, and the NMOS transistor 237 performs switching operation in response to the output signal of the inverter INV21.

In test mode, the second buffer 234 is turned on because the test mode signal TMRS is in enabled state, that is, outputs of the NOR gates NOR21 and NOR22 are in disabled state irrespective of logic state of the output clock signal CDQ_IN. In this case, the second multiplexer 230 buffers the multiplexer input signal DDRI and outputs the buffered signal.

Figure 12:
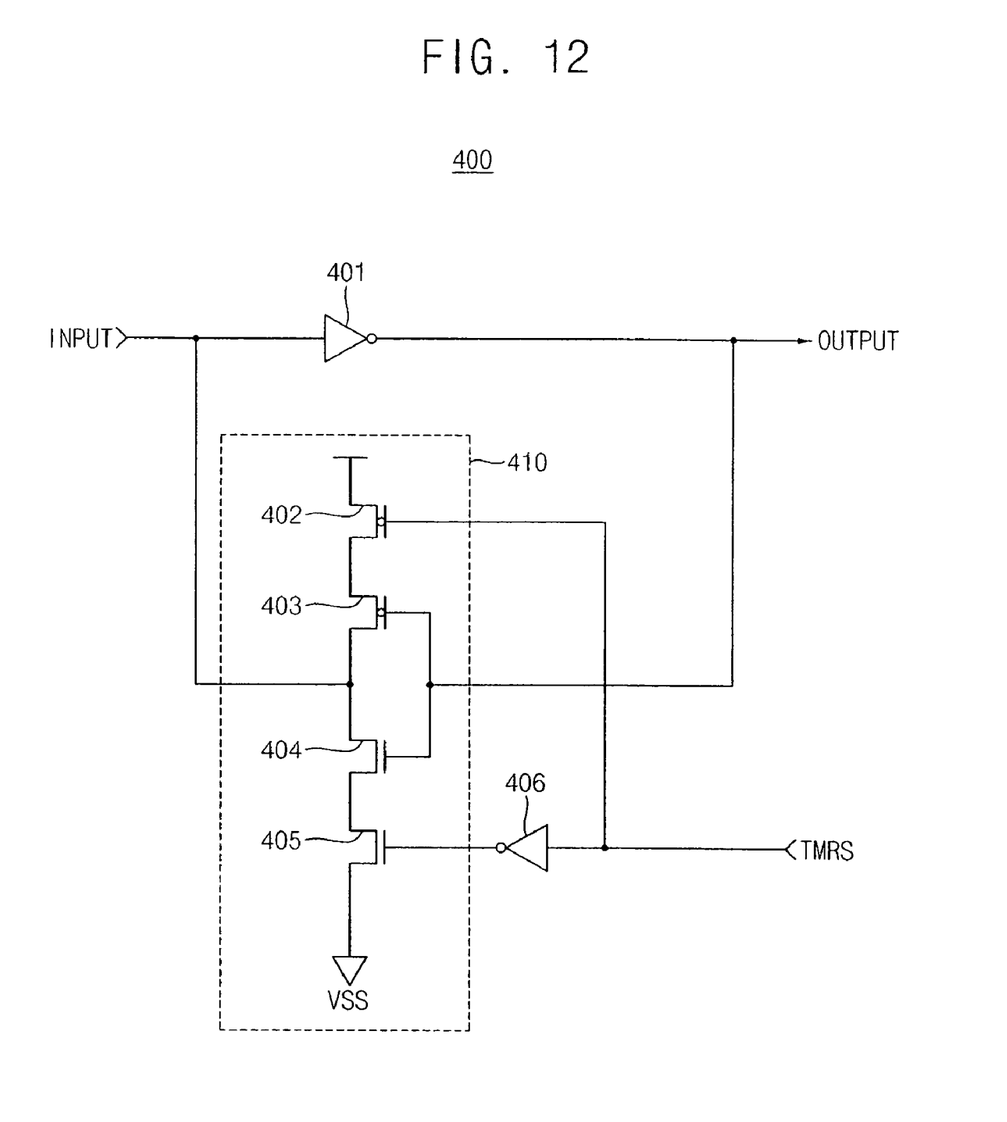
FIG. 12 is a circuit diagram illustrating a latch circuit included in an output circuit of the semiconductor memory device according to an example embodiment of the present invention.

FIG. 12 is a circuit diagram illustrating a latch circuit included in an output circuit of the semiconductor memory device according to an example embodiment of the present invention. A plurality of the latch circuits as illustrated in FIG. 12 may be included in the input/output circuit 200.

Referring to FIG. 12, the latch circuit 400 includes an inverter 401, PMOS transistors 402 and 403, NMOS transistors 404 and 405, and an inverter 406. The PMOS transistors 402 and 403 and the NMOS transistors 404 and 405 constitute an inverting device 410.

The inverter 401 inverts an input signal INPUT and provides an inverted input signal to an output node. The inverting device 410 inverts an output signal OUTPUT and provides an inverted output signal to an input node.

An operation of the latch circuit of FIG. 12 is as follows.

When the semiconductor memory device operates in normal mode, that is, the test mode signal TMRS is in disabled state, the PMOS transistor 402 and the NMOS transistor 405 are turned on. Accordingly, the inverting device 410 inverts the output signal OUTPUT and provides the inverted output signal to the input node. Therefore the latch circuit 400 performs latching operation fully when the semiconductor memory device operates in normal mode.

When the semiconductor memory device operates in test mode, that is, the test mode signal TMRS is in enabled state, the PMOS transistor 402 and the NMOS transistor 405 are turned off. Accordingly, the inverting device 410 does not operate. Consequently, the latch circuit 400 operates as a partial semi-latch when the semiconductor memory device operates in test mode.

The output signal SAO of the input/output sense amplifier may be outputted through an output pin when the latch enable signal FRP is in enabled state because the latch circuits included in the output circuit of the semiconductor memory device 200 are disabled.

A method for controlling an input/output sense amplifier (IOSA) 100 included in the semiconductor memory device includes generating a first latch enable signal having a second pulse shape in response to an auto pulse signal in normal mode, activating a latch in the IOSA in response to the first latch enable signal, generating a second latch enable signal having a level shape in response to a write enable bar signal WEB in test mode, and activating the latch in the IOSA in response to the second latch enable signal.

Figure 13:
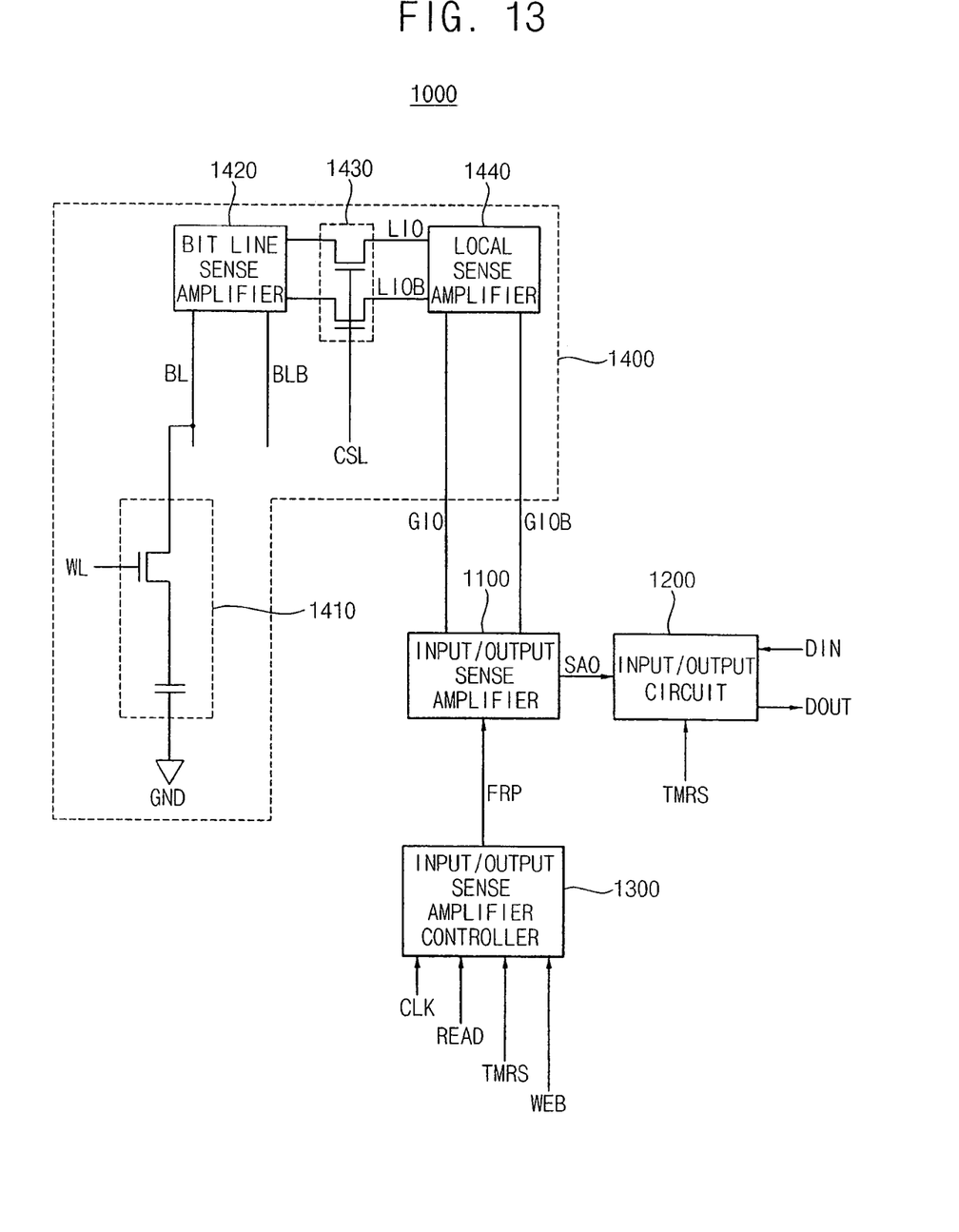
FIG. 13 is a circuit diagram illustrating an entire circuit of a semiconductor memory device including the circuit of FIG. 3 according to an example embodiment of the present invention.

FIG. 13 is a circuit diagram of a semiconductor memory device including the circuit of FIG. 3 according to an example embodiment of the present invention.

Referring to FIG. 13, a semiconductor memory device 1000 includes a memory core 1400, an input/output sense amplifier (IOSA) 1100, an input/output circuit 1200, and an input/output sense amplifier (IOSA) controller 1300.

The memory core 1400 outputs data stored in a memory cell through a global input/output line pair GIO and GIOB, and stores data provided from the global input/output line pair GIO and GIOB. The IOSA 1100 turn on or off an included latch in response to a latch enable signal FRP, and amplifies a signal of the global input/output line pair GIO and GIOB to generate first data SAO. The latch enable signal FRP has a second pulse shape in normal mode and a level shape in test mode. The IO circuit 1200 operates in response to a test mode signal TMRS. The IO circuit 1200 determines an output order of the first data SAO, selects an output bit structure, and performs a parallel-to-serial conversion to generate output data DOUT. In addition, the IO circuit 1200 receives input data from an external source, buffers input data DIN received from an external source, and provides the buffered input data DIN to the IOSA 1100. The IOSA controller 1300 generates the latch enable signal FRP in response to a clock signal CLK, a read signal READ, the test mode MRS (Mode Register Set) signal TMRS, and a write enable bar WEB signal. The IOSA controller 1300 generates a latch enable signal having a second pulse shape in response to an auto pulse signal in normal mode, and the IOSA controller 1300 generates a latch enable signal having level shape, which is in enabled state for a long duration in response to the write enable bar WEB signal in test mode.

The memory core 1400 includes a memory cell 1410, a bit line sense amplifier 1420, a switching circuit 1430, and a local sense amplifier 1440.

The memory cell 1410 stores a signal of a bit line BL in response to a word line drive signal WL or outputs data of the memory cell 1410 to the bit line BL. The bit line sense amplifier 1420 amplifies the signal on the bit line BL. The switching circuit 1430 electrically connects a bit line pair BL and BLB with a local input/output line pair LIO and LIOB in response to a column select signal CSL.

The semiconductor memory device 1000 in FIG. 13 may test not only valid data but also invalid data based on the latch enable signal having level shape, which controls the IOSA 1100 and is enabled for a long duration in test mode.

As described above, the semiconductor memory device including an IOSA according to example embodiments of the present invention may safely test a characteristic of the IOSA. The semiconductor memory device may test not only valid data but also invalid data and a noise signal that are outputted from the IOSA according to the example embodiments of the present invention.

While the example embodiments of the present invention and their advantages have been described in detail, it should be understood that various changes, substitutions and alterations may be made herein without departing from the scope of the invention.

What is claimed is:

1. An input/output sense amplifier (IOSA) control circuit comprising:
    an auto pulse generator configured to generate an auto pulse signal having a first pulse shape; and
    a latch enable signal generating circuit configured to generate a first latch enable signal having a second pulse shape that activates a latch in the IOSA in response to the auto pulse signal in normal mode, and configured to generate a second latch enable signal having a level shape for activating the latch in response to a write enable bar signal in test mode.

2. The IOSA control circuit of claim 1, wherein the second latch enable signal is in an enabled state during a first interval when valid output data is generated and during a second interval when an invalid output data is generated.

3. The IOSA control circuit of claim 1, wherein the auto pulse generator is configured to generate the auto pulse signal in response to a column select signal.

4. The IOSA control circuit of claim 3, wherein the first latch enable signal is generated when a test mode signal is in a disabled state and the second latch enable signal is generated when the test mode signal is in an enabled state.

5. The IOSA control circuit of claim 4, wherein the test mode signal corresponds to a test mode register set signal.

6. The IOSA control circuit of claim 4, wherein the latch enable signal generating circuit comprises:
    a first inverter that inverts the test mode signal;
    a second inverter that inverts the write enable bar signal;
    a first AND gate that performs an AND operation on the auto pulse signal and an output signal of the first inverter to generate a first signal;
    a second AND gate that performs an AND operation on the test mode signal and an output signal of the second inverter to generate a second signal; and
    an OR gate that performs an OR operation on the first signal and the second signal to output the first latch enable signal and the second latch enable signal.

7. The IOSA control circuit of claim 3, further comprising a column select signal generating circuit configured to generate the column select signal based on a clock signal and a read signal.

8. A method of controlling an input/output sense amplifier (IOSA), comprising:
    generating a first latch enable signal having a second pulse shape in response to an auto pulse signal having a first pulse shape in a normal mode;
    activating a latch included in the IOSA in response to the first latch enable signal;
    generating a second latch enable signal having a level shape in response to a write enable bar signal in a test mode; and
    activating the latch included in the IOSA in response to the second latch enable signal.

9. The method of claim 8, wherein the second latch enable signal is in an enabled state during a first interval when valid output data is generated and during a second interval when invalid output data is generated.

* * * * *

UNITED STATES PATENT AND TRADEMARK OFFICE
CERTIFICATE OF CORRECTION

PATENT NO. : 7,554,866 B2 Page 1 of 1
APPLICATION NO. : 11/820836
DATED : June 30, 2009
INVENTOR(S) : Jang-Won Moon et al.

It is certified that error appears in the above-identified patent and that said Letters Patent is hereby corrected as shown below:

Title Page;
On the cover sheet, item (73) Assignee, replace "Electroncis" with --Electronics--

Signed and Sealed this

Seventeenth Day of November, 2009

David J. Kappos
*Director of the United States Patent and Trademark Office*